US012666962B2

(12) United States Patent
Kondo et al.

(10) Patent No.: US 12,666,962 B2
(45) Date of Patent: Jun. 23, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Katsuhiko Kondo, Tokyo (JP); Takuya Shiratsuru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 461 days.

(21) Appl. No.: 18/257,067

(22) PCT Filed: Apr. 2, 2021

(86) PCT No.: PCT/JP2021/014336
§ 371 (c)(1),
(2) Date: Jun. 12, 2023

(87) PCT Pub. No.: WO2022/208870
PCT Pub. Date: Oct. 6, 2022

(65) Prior Publication Data
US 2024/0047294 A1 Feb. 8, 2024

(51) Int. Cl.
*H01L 23/367* (2006.01)
*H01L 21/48* (2006.01)
(Continued)

(52) U.S. Cl.
CPC ......... *H10W 40/22* (2026.01); *H10W 40/258* (2026.01); *H10W 40/259* (2026.01);
(Continued)

(58) Field of Classification Search
CPC . H01L 23/367; H01L 23/053; H01L 23/3731; H01L 23/3736; H01L 21/4871;
(Continued)

(56) References Cited

U.S. PATENT DOCUMENTS

| 2007/0147005 | A1* | 6/2007 | Harada | ............... | H01L 23/3735 |
| | | | | | 257/E23.101 |
| 2008/0206928 | A1 | 8/2008 | Onishi et al. | | |
| 2008/0291628 | A1 | 11/2008 | Aoki et al. | | |
| 2016/0035646 | A1 | 2/2016 | Soyano | | |
| 2016/0307817 | A1 | 10/2016 | Kimura et al. | | |

(Continued)

FOREIGN PATENT DOCUMENTS

| JP | 2000-091481 A | 3/2000 |
| JP | 2002-329939 A | 11/2002 |

(Continued)

OTHER PUBLICATIONS

International Search Report issued in PCT/JP2021/014336; mailed Jul. 6, 2021.

(Continued)

*Primary Examiner* — Peniel M Gumedzoe
(74) *Attorney, Agent, or Firm* — Studebaker Brackett PLLC

(57) ABSTRACT

Provided are a semiconductor device capable of reducing damage on a resin case by heating during manufacture and a method of manufacturing a semiconductor device capable of reducing damage on a resin case by heating during manufacture. A semiconductor device includes a base plate, an insulating substrate, a semiconductor element, and a resin case. The base plate includes first and second regions whose positions differ from each other in a plan view. The insulating substrate is bonded on an upper surface of the second region. The insulating substrate includes a circuit pattern on an upper surface. The semiconductor element is bonded on the circuit pattern. The resin case is bonded on an upper surface of the first region. Thermal resistance between the upper surface and a lower surface of the first region is higher than thermal resistance between the upper surface and a lower surface of the second region.

15 Claims, 8 Drawing Sheets

200

500

(51) Int. Cl.

| | |
|---|---|
| *H01L 23/00* | (2006.01) |
| *H01L 23/053* | (2006.01) |
| *H01L 23/373* | (2006.01) |
| *H10W 40/22* | (2026.01) |
| *H10W 40/25* | (2026.01) |
| *H10W 70/02* | (2026.01) |
| *H10W 76/15* | (2026.01) |
| *H10W 72/00* | (2026.01) |
| *H10W 90/00* | (2026.01) |

(52) U.S. Cl.

CPC ........... *H10W 70/02* (2026.01); *H10W 76/15* (2026.01); *H10W 72/886* (2026.01); *H10W 90/734* (2026.01); *H10W 90/761* (2026.01)

(58) Field of Classification Search

CPC ......... H01L 24/32; H01L 24/40; H01L 24/73; H01L 2224/32225; H01L 2224/40151; H01L 2224/73263; H10W 40/22; H10W 40/259; H10W 40/528; H10W 70/02; H10W 76/15; H10W 72/886; H10W 90/734; H10W 90/761

See application file for complete search history.

(56) References Cited

U.S. PATENT DOCUMENTS

| | | | |
|---|---|---|---|
| 2018/0240730 A1* | 8/2018 | Hirao | .................. H01L 23/3733 |
| 2019/0103334 A1 | 4/2019 | Tanaka | |
| 2020/0161145 A1 | 5/2020 | Mafune | |

FOREIGN PATENT DOCUMENTS

| | | | |
|---|---|---|---|
| JP | 2008-207207 A | 9/2008 | |
| JP | 2008-294068 A | 12/2008 | |
| JP | 2016-207706 A | 12/2016 | |
| JP | 2017-069581 A | 4/2017 | |
| JP | 2019-067886 A | 4/2019 | |
| JP | 2019-197831 A | 11/2019 | |
| JP | 2020-088053 A | 6/2020 | |

OTHER PUBLICATIONS

An Office Action; "Notice of Reasons for Refusal," mailed by the Japanese Patent Office on Apr. 2, 2024, which corresponds to Japanese Patent Application No. 2023-510136 and is related to U.S. Appl. No. 18/257,067; with English language translation.

* cited by examiner

F I G. 1
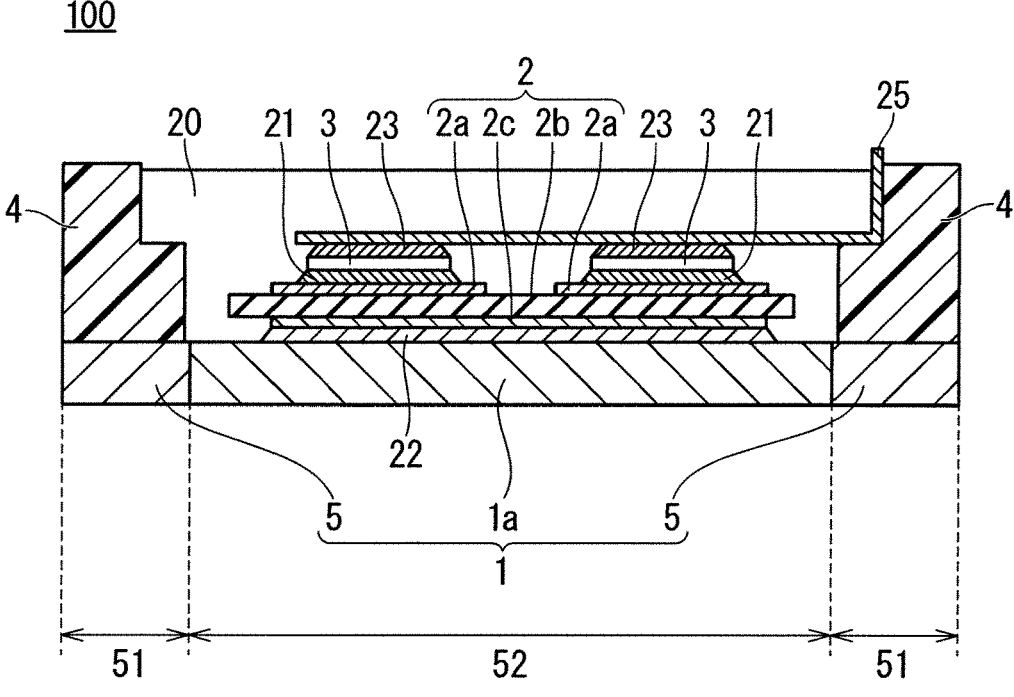
F I G. 2
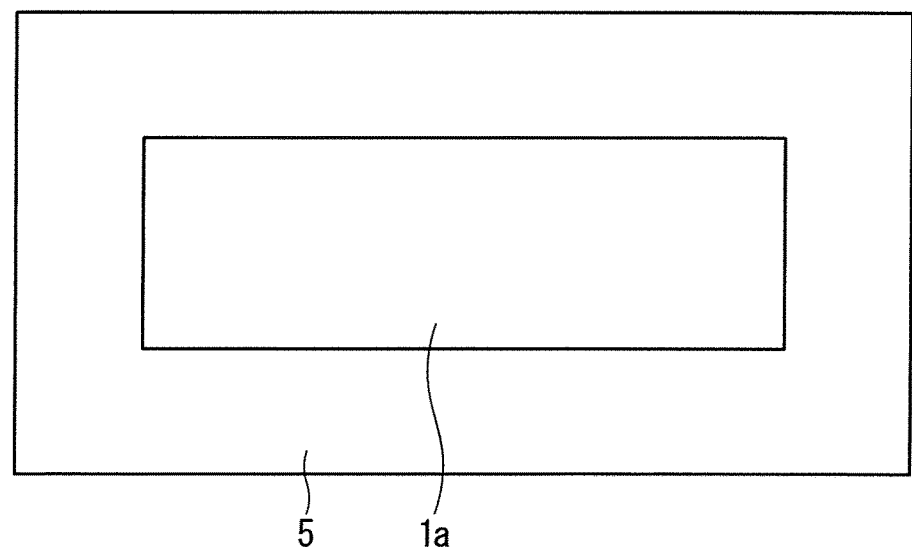

F I G. 3
200
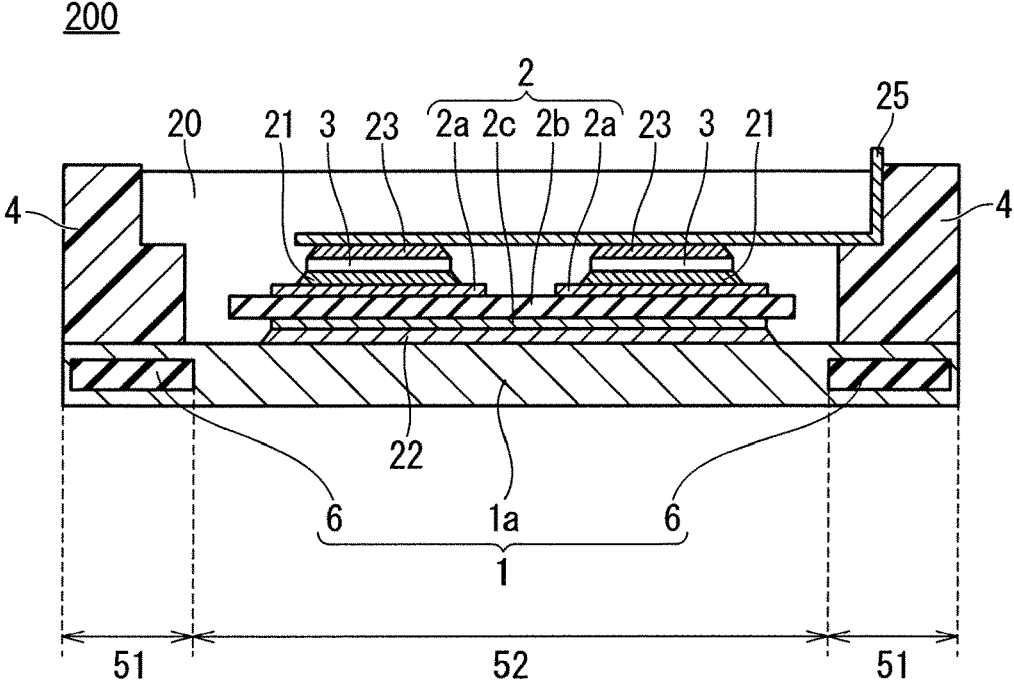
F I G. 4
300
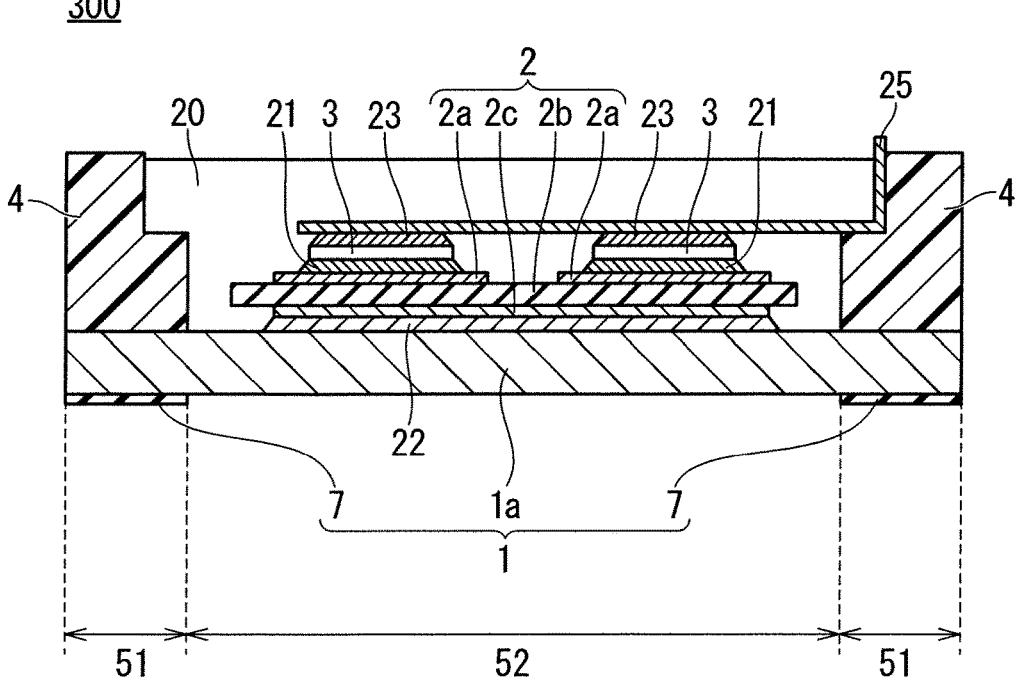

400

500

F I G. 9
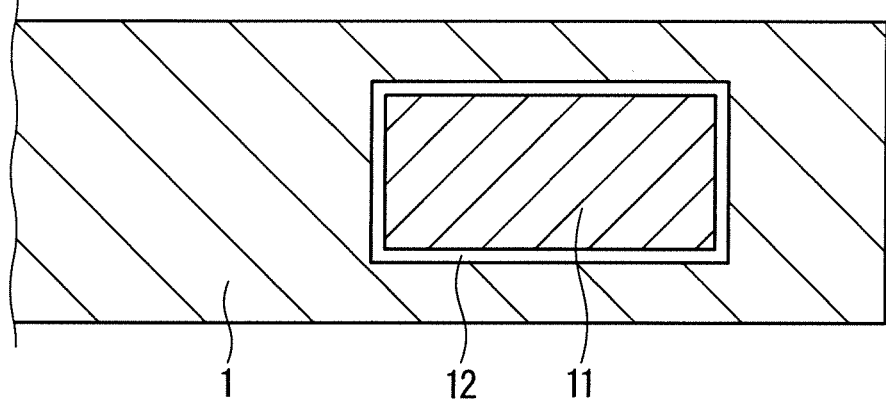
1        12    11
F I G. 10
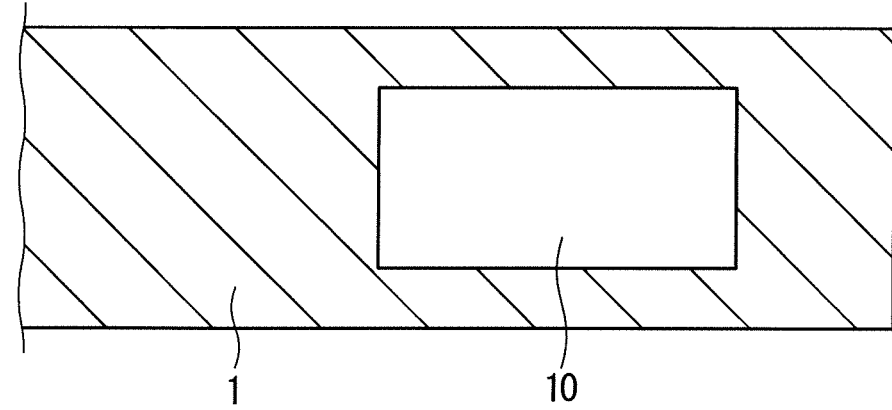
1              10

F I G. 11
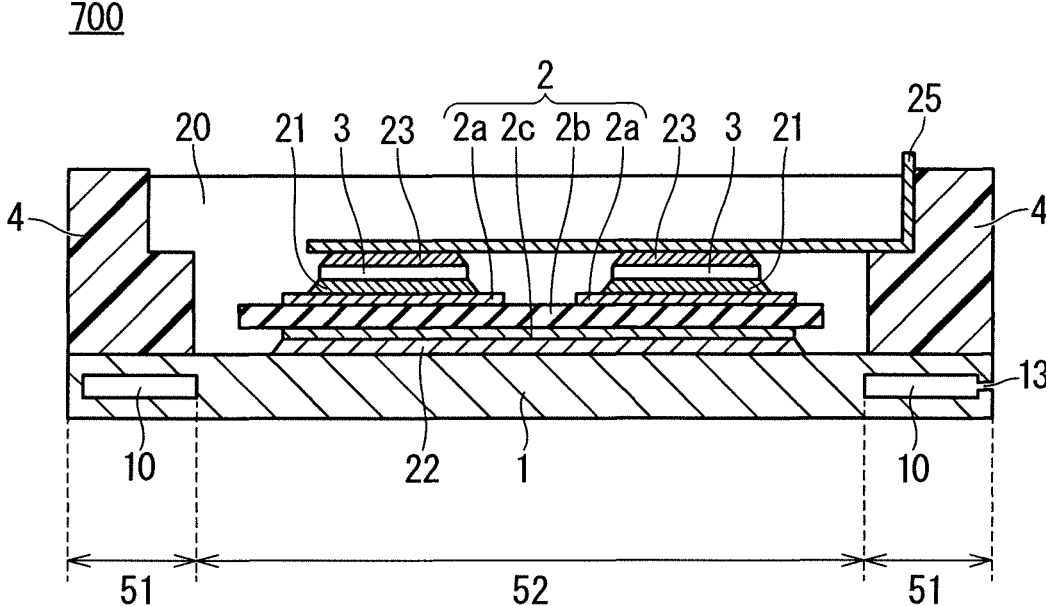
F I G. 12
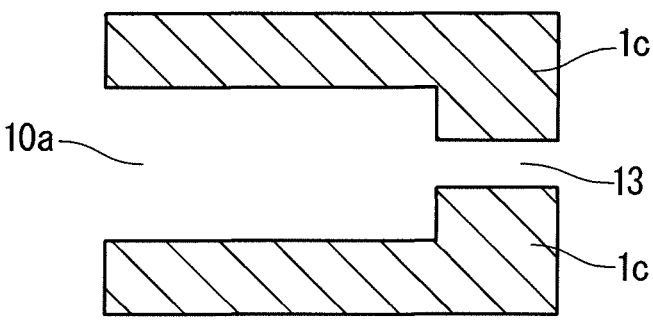

F I G. 13
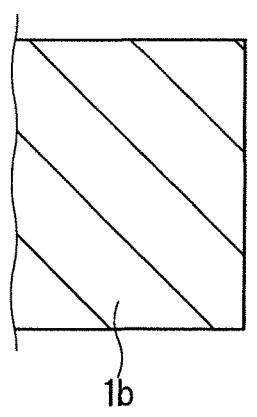
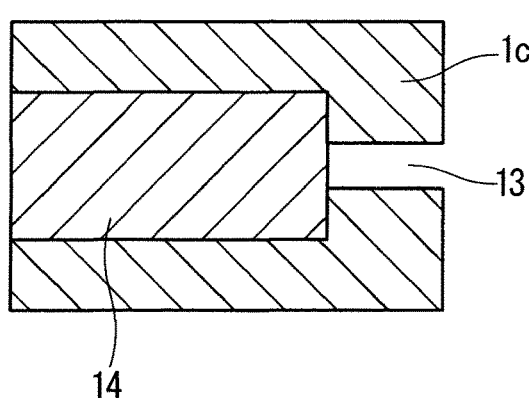
F I G. 14
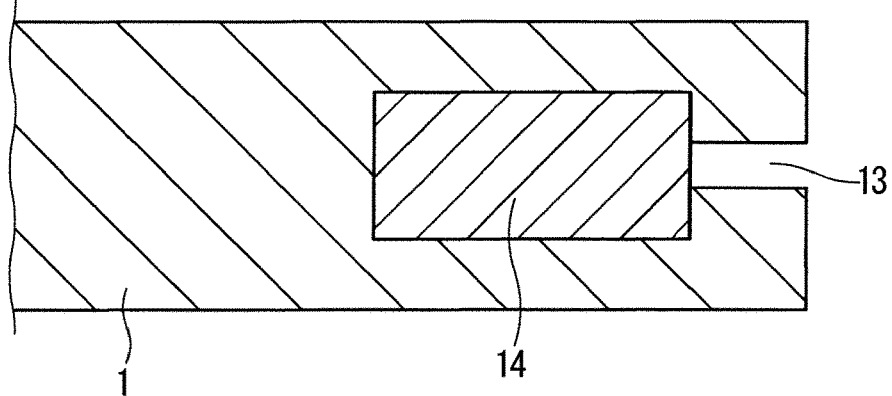
F I G. 15
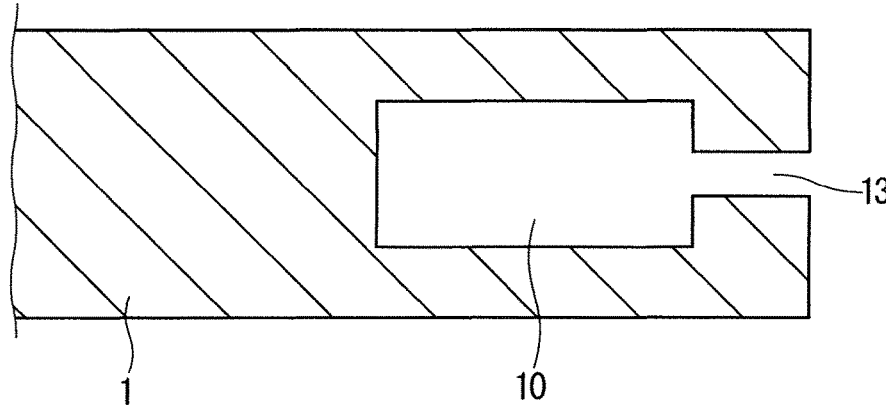

F I G. 16
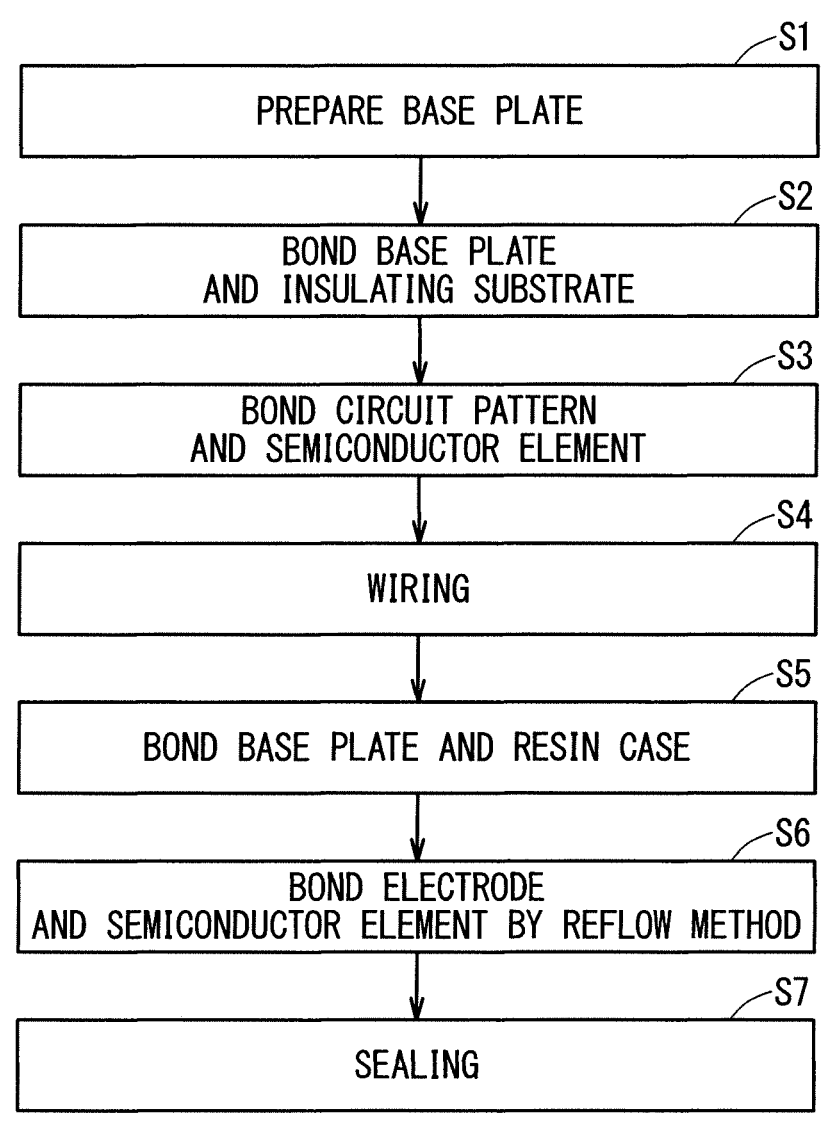

SEMICONDUCTOR DEVICE AND METHOD OF MANUFACTURING SEMICONDUCTOR DEVICE

TECHNICAL FIELD

The present disclosure relates to a semiconductor device and a method of manufacturing the semiconductor device.

BACKGROUND ART

Patent Document 1 discloses a semiconductor device including a case.

PRIOR ART DOCUMENTS

Patent Document(s)

Patent Document 1: Japanese Patent Application Laid-Open No. 2019-067886

SUMMARY

Problem to be Solved by the Invention

When a temperature of a resin case gets high by heating at a time of manufacturing a semiconductor device, the resin case gets damage. Such a problem is not sufficiently considered in Patent Document 1.

The present disclosure is to solve such a problem, and an object of the present disclosure is to provide a semiconductor device capable of reducing damage on a resin case by heating during manufacture and a method of manufacturing a semiconductor device capable of reducing damage on a resin case by heating during manufacture.

Means to Solve the Problem

A semiconductor device according to the present disclosure is a semiconductor device including a base plate, an insulating substrate, a semiconductor element, and a resin case, wherein the base plate includes a first region and a second region which are regions located in positions different from each other in a plan view, the insulating substrate is bonded on an upper surface of the second region in the base plate, the insulating substrate includes a circuit pattern on an upper surface, the semiconductor element is bonded on the circuit pattern, the resin case is bonded on an upper surface of the first region in the base plate, and thermal resistance between the upper surface and a lower surface of the first region in the base plate is higher than thermal resistance between the upper surface and a lower surface of the second region in the base plate.

Effects of the Invention

According to the present disclosure, provided is a semiconductor device capable of reducing damage on a resin case by heating during manufacture.

These and other objects, features, aspects and advantages of the technique disclosed in the specification of the present application will become more apparent from the following detailed description of the present invention when taken in conjunction with the accompanying drawings.

BRIEF DESCRIPTION OF DRAWINGS

FIG. 1 A cross-sectional view illustrating a structure of a semiconductor device according to an embodiment 1.

FIG. 2 A plan view of a base plate of the semiconductor device according to the embodiment 1.

FIG. 3 A cross-sectional view illustrating a structure of a semiconductor device according to an embodiment 2.

FIG. 4 A cross-sectional view illustrating a structure of a semiconductor device according to an embodiment 3.

FIG. 9 A diagram for explaining a process of forming the base plate of the semiconductor device according to the embodiment 6.

FIG. 10 A diagram for explaining a process of forming the base plate of the semiconductor device according to the embodiment 6.

FIG. 11 A cross-sectional view illustrating a structure of a semiconductor device according to an embodiment 7.

FIG. 12 A diagram for explaining a process of forming a base plate of the semiconductor device according to the embodiment 7.

FIG. 13 A diagram for explaining a process of forming the base plate of the semiconductor device according to the embodiment 7.

FIG. 14 A diagram for explaining a process of forming the base plate of the semiconductor device according to the embodiment 7.

FIG. 15 A diagram for explaining a process of forming the base plate of the semiconductor device according to the embodiment 7.

FIG. 16 A flow chart illustrating an example of a method of manufacturing the semiconductor device according to the embodiment 1.

DESCRIPTION OF EMBODIMENT(S)

Figure 5:
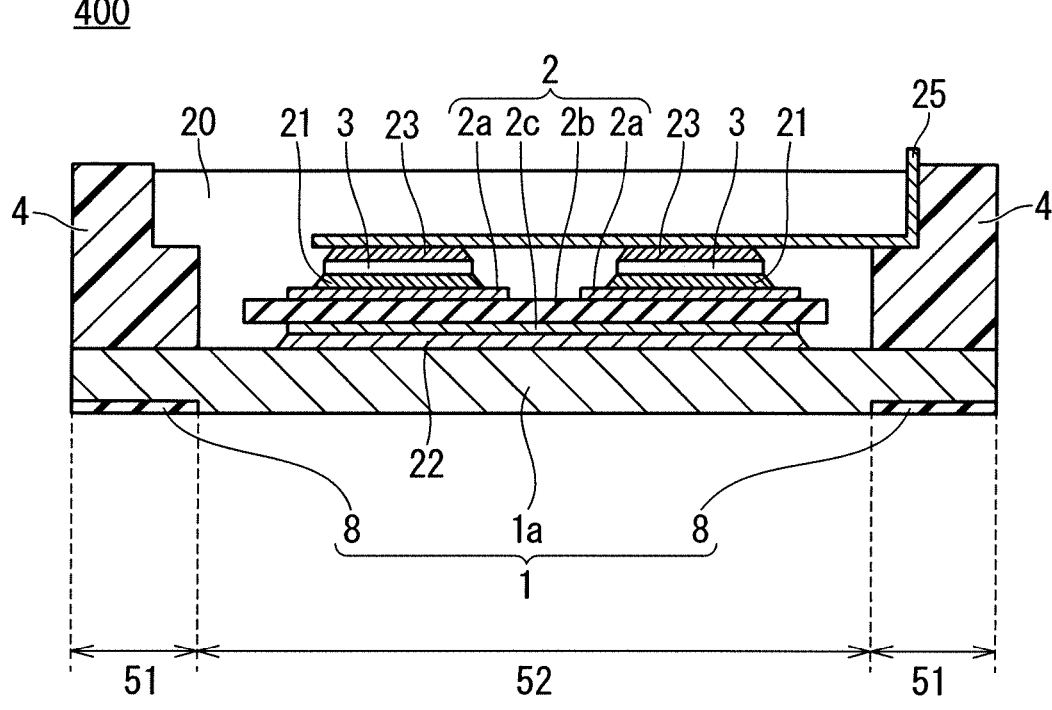
FIG. 5 A cross-sectional view illustrating a structure of a semiconductor device according to an embodiment 4.

In the description hereinafter, an expression of a top and a bottom indicates that one direction of a semiconductor device is an upper direction and an opposite direction thereof is a lower direction, thus does not limit an up-down direction at a time of manufacturing or using the semiconductor device.

A. Embodiment 1

A-1. Configuration

FIG. 1 is a cross-sectional view illustrating a structure of a semiconductor device 100 according to an embodiment 1.

The semiconductor device 100 includes a base plate 1, an insulating substrate 2, a semiconductor element 3, a resin case 4, a sealing material 20, and an electrode 25.

The base plate 1 has a plate-like shape.

The base plate 1 includes an outer peripheral region 51 (an example of a first region) and a central region 52 (an example of a second region) which are regions located in positions different from each other in a plan view. The base plate 1 includes a member 1a and a member 5. A region in the base plate 1 made up of the member 5 is the outer peripheral region 51, and a region in the base plate 1 made up of the member 1a is the central region 52.

FIG. 2 is a plan view of the base plate 1. The member 1a is located in a center part of the base plate 1, and the member 5 is located in an outer peripheral part of the base plate 1.

The member 5 has a lower thermal conductivity than the member 1a. The member 1a is metal, for example. The member 1a is made of copper, copper alloy, aluminum, or aluminum alloy, for example. The member 5 is metal, for example. The member 5 is made up of an iron series material, for example.

The member 1a and the member 5 are integrated by a bonding method such as friction stir welding (FSW) after being formed separately, for example. When both the member 1a and the member 5 are made of metal, the member 1a and the member 5 can be integrated by FSW.

The insulating substrate 2 includes a circuit pattern 2a, an insulating layer 2b, and a circuit pattern 2c. The circuit pattern 2a is provided on one main surface of the insulating layer 2b, and the circuit pattern 2c is provided on the other main surface of the insulating layer 2b. The circuit pattern 2a is selectively formed on one main surface to constitute a circuit necessary for the semiconductor 100.

The circuit pattern 2c of the insulating substrate 2 is bonded on an upper surface of the central region 52 in the base plate 1 by a bonding material 22. The bonding material 22 is solder, for example. The bonding material 22 is lead-free solder such as Sn—Ag series solder, for example. The insulating substrate 2 may not include the circuit pattern 2c. In such a case, the base plate 1 and the insulating layer 2b of the insulating substrate 2 are bonded to each other.

The insulating layer 2b is a ceramic layer, for example. The insulating layer 2b is made of ceramic such as $Al_2O_3$, AlN, or $Si_3N_4$, for example.

Each of the circuit pattern 2a and the circuit pattern 2c is a conductor. Each of the circuit pattern 2a and the circuit pattern 2c is metal, for example. Each of the circuit pattern 2a and the circuit pattern 2c is made of copper, copper alloy, aluminum, or aluminum alloy.

An electrode (for example, a collector electrode) on a side of a lower surface of the semiconductor element 3 is bonded on the circuit pattern 2a via the bonding material 21. The bonding material 21 is solder, for example. The bonding material 21 is lead-free solder such as Sn—Ag series solder, for example.

The semiconductor element 3 includes an electrode (for example, an emitter electrode and a gate electrode) also on a side of an upper surface. Various types of wiring such as a bonding wire and a metal plate, for example, is connected to the electrode on the side of the upper surface of the semiconductor element 3. For example, as illustrated in FIG. 1, the electrode 25 is bonded to the electrode (for example, an emitter electrode) on the side of the upper surface of the semiconductor element 3 by a bonding material 23. The bonding material 23 is solder, for example. The bonding material 23 is lead-free solder such as Sn—Ag series solder, for example. The electrode 25 is for supplying electrical power to the semiconductor device 100 from an outer side of the semiconductor device 100. The electrode 25 may be bonded to the circuit pattern 2a instead of the semiconductor element 3.

FIG. 1 illustrates two semiconductor elements 3, however, the number of semiconductor elements 3 included in the semiconductor device 100 may be one or three or more. When the semiconductor device 100 includes a plurality of semiconductor elements, the plurality of semiconductor elements may be the same, or may also be different from each other.

The semiconductor element 3 is a power semiconductor element including an Si semiconductor, an SiC semiconductor, or a GaN semiconductor, for example. The semiconductor element 3 is a metal oxide semiconductor field effect transistor (MOSFET), a diode, an insulated gate bipolar transistor (IGBT), or a reverse-conducting IGBT (RC-IGBT), for example. These semiconductor elements generate high heat in operation, thus it is important to ensure high heat dissipation properties.

The resin case 4 is a case made of resin. The resin case 4 is formed of polyphenylene sulfide (PPS), for example.

The resin case 4 is disposed on the base plate 1 to surround a circuit in the semiconductor device 100 including the semiconductor element 3 in a plan view. The resin case 4 is bonded on an upper surface of the outer peripheral region 51 in the base plate 1 by an adhesive agent (not shown), for example.

The resin case 4 may be bonded to only the upper surface of the outer peripheral region 51, or may also be bonded across the upper surface of the outer peripheral region 51 and the upper surface of the central region 52. When the member 5 having a low thermal conductivity is disposed only in a region where the resin case 4 is bonded to the upper surface, reduction of heat dissipation properties from the semiconductor element 3 can be suppressed. When the member 5 having a low thermal conductivity is disposed in a whole region where the resin case 4 is bonded to the upper surface, damage on the resin case 4 at a time heating from the side of the lower surface of the base plate 1 in a manufacturing process can be suppressed.

An inner side of the resin case 4 is sealed by the sealing material 20. A circuit in the semiconductor device 100 is protected by the sealing material 20. The sealing material 20 is resin, for example. The sealing material 20 is silicone gel or epoxy resin, for example.

A-2. Manufacturing Method

FIG. 16 is a flow chart illustrating an example of a method of manufacturing a semiconductor device according to the present embodiment.

The base plate 1 is prepared firstly (Step S1). The base plate 1 is formed by bonding the member 1a and the member 5 by FSW after the member 1a and the member 5 are separately formed as described above, for example.

After Step S1, the base plate 1 and the insulating substrate 2 are bonded by the bonding material 22 (Step S2).

After Step S2, the circuit pattern 2a of the insulating substrate 2 and the semiconductor element 3 are bonded by the bonding material 21 (Step S3).

After Step S3, wiring for constituting the circuit of the semiconductor device 100 is performed using a bonding wire etc. (Step S4).

After Step S4, the base plate 1 and the resin case 4 are bonded (Step S5). The base plate 1 and the resin case 4 are bonded by an adhesive agent, for example. The base plate 1 and the resin case 4 may be bonded by a screw. The electrode 25 is attached to the resin case 4. The bonding material 23 is disposed between the electrode 25 and the semiconductor element 3 at a time of bonding the resin case 4 to the base plate 1.

After Step S5, the electrode 25 and the semiconductor element 3 are bonded by heating from a side of a lower surface of the base plate 1 by a reflow method. Accordingly, the electrode 25 and the semiconductor element 3 are bonded (Step S6). For example, the bonding material 23 is solder, and the electrode 25 and the semiconductor element 3 are soldered by the reflow method.

The base plate 1 and the insulating substrate 2 may be bonded by a method of temporarily fixing the base plate 1 and the insulating substrate with the bonding material 22 therebetween in Step S2, and bonding them by the reflow method in Step S6. The circuit pattern 2a and the semiconductor element 3 may be bonded by a method of temporarily fixing the circuit pattern 2a and the semiconductor element 3 with the bonding material 21 therebetween in Step S3, and also bonding them by the reflow method in Step S6.

After Step S6, the inner side of the resin case 4 is sealed by the sealing material 20 (Step S7).

The semiconductor device 100 is obtained through the processes described above.

When the soldering is performed by the reflow method while the base plate 1 and the resin case 4 are bonded in the process of manufacturing the semiconductor device 100, the base plate 1 is brought into contact with a heat source such as a heater to melt the solder in a short time. The heat from the heat source is also transmitted to the resin case 4 bonded to the base plate 1. The solder needs to be heated to a temperature equal to or higher than a melting point to melt the solder. Although the resin case 4 is made of high heat-resistance resin such as PPS, for example, a melting point thereof is merely slightly higher than that of the solder, for example. When the temperature of the resin case 4 gets too high, there is a possibility that the resin case 4 gets damage such as softening or melting of the resin and eventually occurrence of a crack. When the resin case 4 gets such damage, there is a possibility that insulation failure and reduction of fastening strength between the resin case 4 and a cooler, for example, occur, and reliability in using the semiconductor device 100 is deteriorated.

In the semiconductor device 100 according to the present embodiment, the member 5 having a lower thermal conductivity than the member 1a is disposed in the outer peripheral region 51, thus thermal resistance between the upper and lower surfaces of the outer peripheral region 51 is higher than that between the upper and lower surfaces of the central region 52 in the base plate 1. Thus, when the soldering is performed by the reflow method, the heat applied from the side of the lower surface of the base plate 1 is difficult to be transmitted to the resin case 4, and the damage on the resin case 4 is suppressed. Accordingly, productivity and reliability of the semiconductor device 100 are improved. The member 5 having a low thermal conductivity is used for the outer peripheral region 51, thus suppressed is deterioration of heat dissipation properties from the semiconductor element 3 caused by using the member 5 having the low thermal conductivity.

In the semiconductor device 100 according to the present embodiment, it is possible to suppress damage on the resin case 4 at the time of heating from the side of the lower surface of the base plate 1 while the base plate 1 and the resin case 4 are bonded as well as a case of soldering by the reflow method.

B. Embodiment 2

FIG. 3 is a cross-sectional view illustrating a structure of a semiconductor device 200 according to an embodiment 2.

The semiconductor device 200 is different from the semiconductor device 100 according to the embodiment 1 in the structure of the base plate 1. A structure of the semiconductor device 200 is similar to that of the semiconductor device 100 in the other point.

In the semiconductor device 200, the base plate 1 includes the member 1a and a member 6 (an example of a third member). The member 6 has a lower thermal conductivity than the member 1a. That is to say, the member 6 has a lower thermal conductivity than a part of the base plate 1 other than the member 6.

The member 6 is disposed in the outer peripheral region 51. The member 6 is not disposed in the central region 52.

The member 6 is included in the member 1a. The member 6 is not exposed to the surface of the base plate 1. It is also applicable that the member 6 is not exposed to the surface on upper and lower sides of the base plate 1 but is exposed to a side surface of base plate 1.

The member 6 having a lower thermal conductivity than the member 1a is disposed in the outer peripheral region 51, thus thermal resistance between the upper and lower surfaces of the outer peripheral region 51 is higher than that between the upper and lower surfaces of the central region 52 in the base plate 1. Thus, when the soldering is performed by the reflow method, the heat applied from the side of the lower surface of the base plate 1 is difficult to be transmitted to the resin case 4, and the damage on the resin case 4 is suppressed.

The method of manufacturing the semiconductor device according to the present embodiment is different from that of the semiconductor device according to the embodiment 1 in a method of preparing the base plate 1 in Step S1. The method of manufacturing the semiconductor device according to the present embodiment is similar to that of the semiconductor device according the embodiment 1 in the other point.

In Step S1 of the method of manufacturing the semiconductor device according to the present embodiment, the base plate 1 is manufactured by molding, for example. In such a case, the member 6 is made of a material, such as ceramic, having a higher melting point than the material of the member 1a. That is to say, the melting point of the member 6 is higher than that of a part of the base plate 1 other than the member 6. The member 6 made up of the material having the higher melting point than the material of the member 1a is disposed in a mold, and then, the material of the member 1a is poured in the mold to form the base plate 1. The member 1a is made of copper, copper alloy, aluminum, or aluminum alloy, for example.

C. Embodiment 3

FIG. 4 is a cross-sectional view illustrating a structure of a semiconductor device 300 according to an embodiment 3.

The semiconductor device 300 is different from the semiconductor device 100 according to the embodiment 1 in the structure of the base plate 1. A structure of the semiconductor device 300 is similar to that of the semiconductor device 100 in the other point.

In the semiconductor device 300, the base plate 1 includes the member 1a and a member 7 (an example of a fourth member). The member 7 has a lower thermal conductivity than the member 1a. That is to say, the member 7 has a lower thermal conductivity than a part of the base plate 1 other than the member 7. The member 1a is made of copper, copper alloy, aluminum, or aluminum alloy, for example.

The member 7 is disposed in a portion of the lower surface of the outer peripheral region 51. That is to say, the lower surface of the outer peripheral region 51 in the base plate 1 is coated by the member 7. The member 7 is not disposed in the central region 52 in the base plate 1.

FIG. 4 illustrates a case where only the lower surface of the outer peripheral region 51 in the base plate 1 is coated by the member 7, however, only the upper surface of the outer peripheral region 51 in the base plate 1 may be coated by the member 7, or both the upper surface and the lower surface of the outer peripheral region 51 in the base plate 1 may also be coated by the member 7.

The member 7 having a lower thermal conductivity than the member 1a is disposed in the outer peripheral region 51, thus thermal resistance between the upper and lower surfaces of the outer peripheral region 51 is higher than that between the upper and lower surfaces of the central region 52 in the base plate 1. Thus, when the soldering is performed by the reflow method, the heat applied from the side of the lower surface of the base plate 1 is difficult to be transmitted to the resin case 4, and the damage on the resin case 4 is suppressed.

The method of manufacturing the semiconductor device according to the present embodiment is different from that of the semiconductor device according to the embodiment 1 in a method of preparing the base plate 1 in Step S1. The method of manufacturing the semiconductor device according to the present embodiment is similar to that of the semiconductor device according to the embodiment 1 in the other point.

In Step S1 of the method of manufacturing the semiconductor device according to the present embodiment, the member 7 is formed by applying a heat insulation coating to a surface of the member 1a, for example. The heat insulation coating is a heat insulation coating including ceramic, for example.

D. Embodiment 4

FIG. 5 is a cross-sectional view illustrating a structure of a semiconductor device 400 according to an embodiment 4.

The semiconductor device 400 is different from the semiconductor device 100 according to the embodiment 1 in the structure of the base plate 1. A structure of the semiconductor device 400 is similar to that of the semiconductor device 100 in the other point.

In the semiconductor device 400, the base plate 1 includes the member 1a and an oxide film 8 (an example of a fourth member). The oxide film 8 has a lower thermal conductivity than the member 1a. That is to say, the oxide film 8 has a lower thermal conductivity than a part of the base plate 1 other than the oxide film 8.

The oxide film 8 is disposed in a portion of the lower surface of the outer peripheral region 51. The oxide film 8 is not disposed in the central region 52 in the base plate 1.

FIG. 5 illustrates a case where the oxide film 8 is formed only on the lower surface of the outer peripheral region 51 in the base plate 1, however, the oxide film 8 may be formed only on the upper surface of the outer peripheral region 51 in the base plate 1, or may also be formed on both the upper surface and the lower surface of the outer peripheral region 51 in the base plate 1.

The member 1a is made of copper, copper alloy, aluminum, or aluminum alloy, for example. The oxide film 8 is an oxide film of a material of a part of the base plate 1 other than the oxide film 8. It is preferable that the member 1a is made of aluminum or aluminum alloy by reason that forming the thick oxide film is easier in the case of aluminum or aluminum than in the case of the other metal.

The oxide film 8 having a lower thermal conductivity than the member 1a is disposed in the outer peripheral region 51, thus thermal resistance between the upper and lower surfaces of the outer peripheral region 51 is higher than that between the upper and lower surfaces of the central region 52 in the base plate 1. Thus, when the soldering is performed by the reflow method, the heat applied from the side of the lower surface of the base plate 1 is difficult to be transmitted to the resin case 4, and the damage on the resin case 4 is suppressed.

The method of manufacturing the semiconductor device according to the present embodiment is different from that of the semiconductor device according to the embodiment 1 in a method of preparing the base plate 1 in Step S1. The method of manufacturing the semiconductor device according to the present embodiment is similar to that of the semiconductor device according to the embodiment 1 in the other point.

In Step S1 of the method of manufacturing the semiconductor device according to the present embodiment, after a part of the base plate 1 other than the oxide film 8 is formed, the surface of the base plate 1 is oxidized to form the oxide film 8, thus the base plate 1 having the oxide film 8 is obtained. The surface of the base plate 1 is oxidized by anodic oxidation treatment for example.

The oxide film 8 has a thickness of 1 μm or more, for example, differing from an oxide film naturally formed and having a thickness of several nanometers, for example. The oxide film 8 preferably has a thickness of 10 μm or more to further increase thermal insulation properties.

E. Embodiment 5

Figure 6:
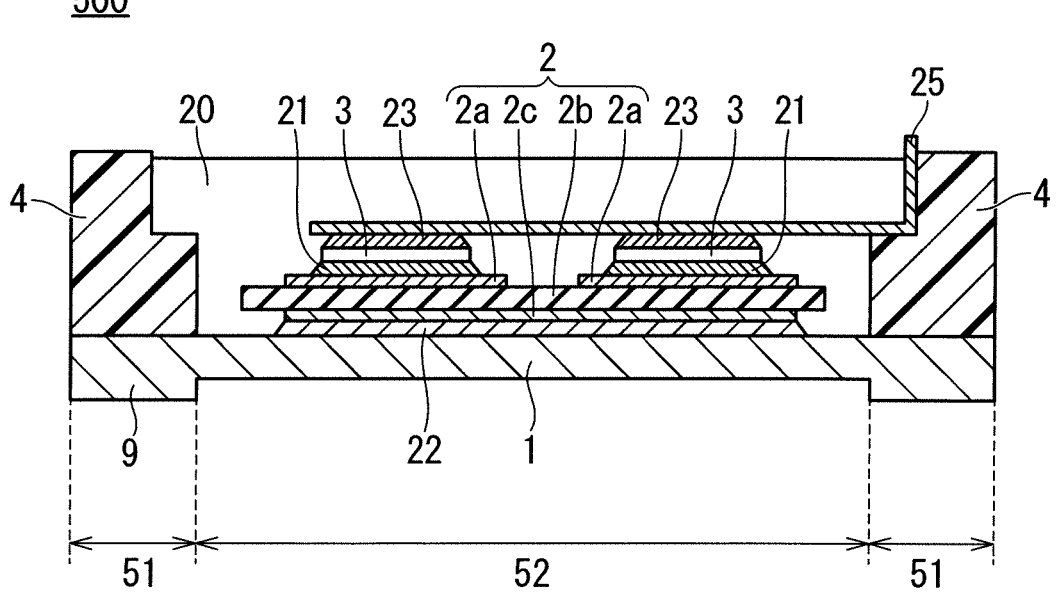
FIG. 6 A cross-sectional view illustrating a structure of a semiconductor device according to an embodiment 5.

FIG. 6 is a cross-sectional view illustrating a structure of a semiconductor device 500 according to an embodiment 5.

The semiconductor device 500 is different from the semiconductor device 100 according to the embodiment 1 in the structure of the base plate 1. A structure of the semiconductor device 500 is similar to that of the semiconductor device 100 in the other point.

The base plate 1 includes a protrusion 9 in the semiconductor device 500. The protrusion 9 is disposed in the outer peripheral region 51. The protrusion 9 is not disposed in the central region 52. In FIG. 6, the protrusion 9 is formed on the side of the lower surface of the base plate 1, however, the protrusion 9 may be formed on the side of the upper surface, or may also be formed on both sides of the upper surface and the lower surface. That is to say, the outer peripheral region 51 has the protrusion 9 on at least one of the upper surface and/or the lower surface, thus is thicker than the central region 52. The thickness of the outer peripheral region 51 is half large again as that of the central region 52, for example.

The outer peripheral region 51 is thicker than the central region 52, thus thermal resistance between the upper and lower surfaces of the outer peripheral region 51 is higher than that between the upper and lower surfaces of the central region 52 in the base plate 1. Thus, when the soldering is performed by the reflow method, the heat applied from the side of the lower surface of the base plate 1 is difficult to be transmitted to the resin case 4, and the damage on the resin case 4 is suppressed.

The method of manufacturing the semiconductor device according to the present embodiment is different from that of the semiconductor device according to the embodiment 1 in a method of preparing the base plate 1 in Step S1. The method of manufacturing the semiconductor device according to the present embodiment is similar to that of the semiconductor device according to the embodiment 1 in the other point.

In Step S1 of the method of manufacturing the semiconductor device according to the present embodiment, the base plate 1 including the protrusion 9 is formed by molding or forging, for example.

F. Embodiment 6

Figure 7:
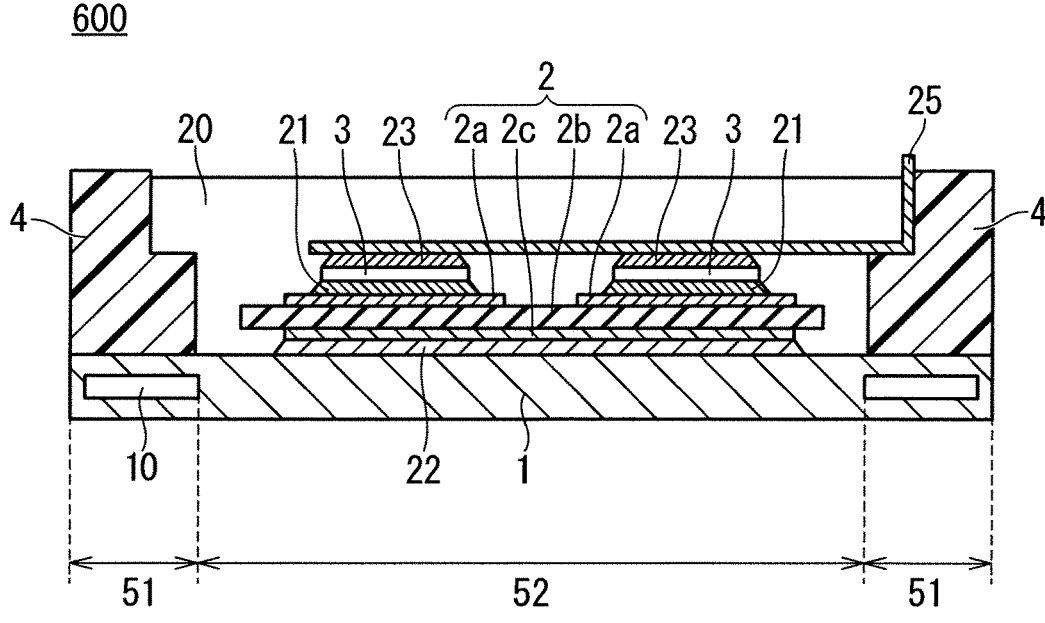
FIG. 7 A cross-sectional view illustrating a structure of a semiconductor device according to an embodiment 6.

FIG. 7 is a cross-sectional view illustrating a structure of a semiconductor device 600 according to an embodiment 6.

The semiconductor device 600 is different from the semiconductor device 100 according to the embodiment 1 in the structure of the base plate 1. A structure of the semiconductor device 600 is similar to that of the semiconductor device 100 in the other point.

The base plate 1 has a hollow part 10 between the upper surface and the lower surface thereof in the semiconductor device 600. It is sufficient that the hollow part 10 is a region whose upper side and lower side are sandwiched by the base plate 1, thus may be included in the base plate 1 without an opening, or may also have an opening in the side surface of the base plate 1.

The hollow part 10 is formed in the outer peripheral region 51. The hollow part 10 is not formed in the central region 52. Accordingly, thermal resistance between the upper and lower surfaces of the outer peripheral region 51 is higher than that between the upper and lower surfaces of the central region 52 in the base plate 1. Thus, when the soldering is performed by the reflow method, the heat applied from the side of the lower surface of the base plate 1 is difficult to be transmitted to the resin case 4, and the damage on the resin case 4 is suppressed.

The method of manufacturing the semiconductor device according to the present embodiment is different from that of the semiconductor device according to the embodiment 1 in a method of preparing the base plate 1 in Step S1. The method of manufacturing the semiconductor device according to the present embodiment is similar to that of the semiconductor device according to the embodiment 1 in the other point.

In Step S1 of the method of manufacturing the semiconductor device according to the present embodiment, the base plate 1 is formed by molding, for example.

Figure 8:
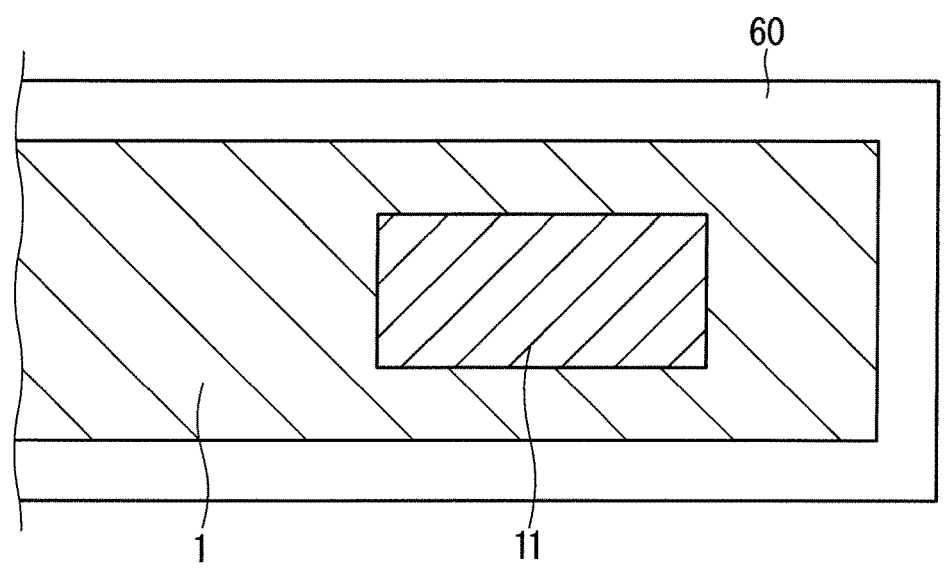
FIG. 8 A diagram for explaining a process of forming a base plate of the semiconductor device according to the embodiment 6.

FIG. 8 to FIG. 10 are diagrams for explaining a process of forming the base plate 1. FIG. 8 to FIG. 10 illustrate only an area near the hollow part 10 in the base plate 1.

Firstly, a member 11 is disposed in a mold 60, and then the material of the base plate 1 is poured in the mold 60 (refer to FIG. 8). The member 11 is made up of a material having a higher melting point than the material of the base plate 1. The material of the base plate 1 is copper, copper alloy, aluminum, or aluminum alloy, for example. The material having a higher melting point than the material of the base plate 1 is an iron series material, for example.

A temperature of the material of the base plate 1 poured in the mold 60 is reduced, and the material thereof is cooled and solidified, thus the base plate 1 is formed. At this time, the base plate 1 and the member 11 shrink by reduction in temperature. When a linear expansion coefficient of the member 11 is different from that of the base plate 1, a gap 12 occurs between the base plate 1 and the member 11 as illustrated in FIG. 9 by a shrinkage of each of the member 11 and the base plate 1 by reason that they are not bonded to each other. With the gap 12, exhaustion of the member 11 described hereinafter is easy.

The member 11 is pressed out and exhausted after the material of the base plate 1 is cooled and solidified, thus the hollow part 10 is formed in the base plate 1 as illustrated in FIG. 10. The hollow part 10 has the opening in the side surface of the base plate 1 so that the member 11 can be pressed out and exhausted. It is also applicable that the opening is closed after the member 11 is exhausted, thus the hollow part 10 does not have the opening.

In this manner, in the present embodiment, after the member 11 having a higher melting point than the material of the base plate 1 is disposed in the region to be the hollow part 10 and the base plate 1 is formed by molding, the member 11 is exhausted from the hollow part 10, thus the hollow part 10 is formed.

G. Embodiment 7

FIG. 11 is a cross-sectional view illustrating a structure of a semiconductor device 700 according to an embodiment 7.

The semiconductor device 700 is different from the semiconductor device 100 according to the embodiment 1 in the structure of the base plate 1. A structure of the semiconductor device 700 is similar to that of the semiconductor device 100 in the other point.

The base plate 1 has the hollow part 10 between the upper surface and the lower surface thereof in the semiconductor device 700. The base plate 1 has a relief hole 13 connected to an outer side of the base plate 1 from the hollow part 10. FIG. 11 illustrates only one relief hole 13, however, the plurality of relief holes 13 may be provided in the base plate 1.

The hollow part 10 is formed in the outer peripheral region 51. The hollow part 10 is not formed in the central region 52. Accordingly, thermal resistance between the upper and lower surfaces of the outer peripheral region 51 is higher than that between the upper and lower surfaces of the central region 52 in the base plate 1. Thus, when the soldering is performed by the reflow method, the heat applied from the side of the lower surface of the base plate 1 is difficult to be transmitted to the resin case 4, and the damage on the resin case 4 is suppressed.

FIG. 12 to FIG. 15 are diagrams for explaining a process of forming the base plate 1. FIG. 12 to FIG. 15 illustrate only an area near the hollow part 10 in the base plate 1.

When the base plate 1 is manufactured, a member 1b of the base plate 1 and a member 1c in which a member 14 is fitted in a depression part are firstly formed as illustrated in FIG. 13. The member 1c having a depression part 10a is firstly formed as illustrated in FIG. 12, and then the member 14 is fitted in the depression part 10a to form the member 1c in which the member 14 is fitted in the depression part. In the cross section illustrated in FIG. 12, the member 1c appears to be divided into a plurality of members, however, the member 1c may be connected in a cross section different from that illustrated in FIG. 12.

The member 1b corresponds to the central region 52, for example, and the member 1c corresponds to the outer peripheral region 51, for example, however, parts of the base plate 1 to which the member 1b and the member 1c correspond, respectively, are not particularly limited. It is also applicable that the member 14 is fitted in the depression part on a side of the member 1b, or the member 14 is fitted in the depression part of each of the member 1b and the member 1c.

Materials of the member 1b and the member 1c are copper, copper alloy, aluminum, or aluminum alloy, for example. The materials of the member 1b and the member 1c are the same, for example, but may be different from each other. The member 14 is formed using a material, such as solder, having a lower melting point than the member 1*b* and the member 1*c*, that is to say, the base plate 1.

The member 1*b* and the member 1*c* are integrated by a bonding method such as FSW from a state illustrated in FIG. 13 to form the base plate 1 (refer to FIG. 14). Subsequently, the base plate 1 is heated to a temperature equal to or larger than a melting point of the member 14, and the melted member 14 is exhausted through the relief hole 13 to form the hollow part 10 (refer to FIG. 15). The relief hole 13 may be closed after the member 14 is exhausted.

In this manner, in the present embodiment, after forming the base plate 1 with the member 14 having a lower melting point than the material of the base plate 1 disposed in the region to be the hollow part 10, the member 14 is melted, and then the melted member 14 is exhausted from the hollow part 10 through the relief hole 13 to form the hollow part 10.

Each embodiment can be arbitrarily combined, or each embodiment can be appropriately varied or omitted.

EXPLANATION OF REFERENCE SIGNS 1 base plate, 1*a*, 1*b*, 1*c*, 5, 6, 7, 11, 14 member, 2 insulating substrate, 2*a*, 2*c* circuit pattern, 2*b* insulating layer, 3 semiconductor element, 4 resin case, 8 oxide film, 9 protrusion, 10 hollow part, 10*a* depression part, 12 gap, 13 relief hole, 20 sealing material, 21, 22, 23 bonding material, 25 electrode, 51 outer peripheral region, 52 central region, 60 mold, 100, 200, 300, 400, 500, 600, 700 semiconductor device.

The invention claimed is:

1. A semiconductor device, comprising:
a base plate;
an insulating substrate;
a semiconductor element; and
a resin case, wherein
the base plate includes a first region and a second region which are regions located in positions different from each other in a plan view,
the insulating substrate is bonded on an upper surface of the second region in the base plate,
the insulating substrate includes a circuit pattern on an upper surface,
the semiconductor element is bonded on the circuit pattern,
the resin case is bonded on an upper surface of the first region in the base plate,
thermal resistance between the upper surface and a lower surface of the first region in the base plate is higher than thermal resistance between the upper surface and a lower surface of the second region in the base plate,
the base plate includes a third member in the first region,
a thermal conductivity of the third member is lower than a thermal conductivity of a part of the base plate other than the third member, and
the third member is not exposed to the upper surface and the lower surface of the base plate.

2. The semiconductor device according to claim 1, wherein
the third member is not exposed to a surface of the base plate.

3. The semiconductor device according to claim 1, wherein
a melting point of the third member is higher than a melting point of a material of a part of base plate other than the third member.

4. The semiconductor device according to claim 1, wherein
the third member is ceramic.

5. A semiconductor device, comprising:
a base plate;
an insulating substrate;
a semiconductor element; and
a resin case, wherein
the base plate includes a first region and a second region which are regions located in positions different from each other in a plan view,
the insulating substrate is bonded on an upper surface of the second region in the base plate,
the insulating substrate includes a circuit pattern on an upper surface,
the semiconductor element is bonded on the circuit pattern,
the resin case is bonded on an upper surface of the first region in the base plate,
thermal resistance between the upper surface and a lower surface of the first region in the base plate is higher than thermal resistance between the upper surface and a lower surface of the second region in the base plate,
the base plate includes a fourth member in a surface part of at least one of an upper side and/or a lower side of the base plate in the first region, and
a thermal conductivity of the fourth member is lower than a thermal conductivity of a part of the base plate other than the fourth member.

6. The semiconductor device according to claim 5, wherein
the fourth member is a coating including ceramic.

7. The semiconductor device according to claim 5, wherein
the fourth member is an oxide film of a material of a part of the base plate other than the fourth member.

8. The semiconductor device according to claim 7, wherein
a thickness of the oxide film is equal to or larger than 1 μm.

9. A method of manufacturing the semiconductor device according to claim 7, wherein
after a part of the base plate other than the fourth member is formed, the surface of the base plate is oxidized to form the fourth member.

10. The method of manufacturing the semiconductor device according to claim 9, wherein
the resin case is bonded on the upper surface of the first region in the base plate, and
soldering by a reflow method is performed by heating from a side of the lower surface of the base plate after the formation of the fourth member and the bonding of the resin case to the upper surface of the first region in the base plate.

11. A semiconductor device, comprising:
a base plate;
an insulating substrate;
a semiconductor element; and
a resin case, wherein
the base plate includes a first region and a second region which are regions located in positions different from each other in a plan view,
the insulating substrate is bonded on an upper surface of the second region in the base plate,
the insulating substrate includes a circuit pattern on an upper surface,
the semiconductor element is bonded on the circuit pattern, the resin case is bonded on an upper surface of the first region in the base plate, thermal resistance between the upper surface and a lower surface of the first region in the base plate is higher than thermal resistance between the upper surface and a lower surface of the second region in the base plate, and the base plate has a hollow part between the upper surface and the lower surface in the first region.

12. A method of manufacturing the semiconductor device according to claim 11, wherein after a member having a higher melting point than the material of the base plate is disposed in a region to be the hollow part and the base plate is formed by molding, the member having the higher melting point than the material of the base plate is exhausted from the hollow part, thereby forming the hollow part.

13. The method of manufacturing the semiconductor device according to claim 12, wherein the resin case is bonded on the upper surface of the first region in the base plate, and soldering by a reflow method is performed by heating from a side of the lower surface of the base plate after the formation of the hollow part and the bonding of the resin case to the upper surface of the first region in the base plate.

14. A method of manufacturing the semiconductor device according to claim 11, wherein after a member having a lower melting point than the material of the base plate is disposed in a region to be the hollow part and the base plate is formed, the member having the lower melting point than the material of the base plate is melted, and the member which has been melted is exhausted from the hollow part through a relief hole, thereby forming the hollow part.

15. The method of manufacturing the semiconductor device according to claim 14, wherein the resin case is bonded on the upper surface of the first region in the base plate, and soldering by a reflow method is performed by heating from a side of the lower surface of the base plate after the formation of the hollow part and the bonding of the resin case to the upper surface of the first region in the base plate.

\* \* \* \* \*